(12) United States Patent
Brown

(10) Patent No.: US 6,858,801 B1
(45) Date of Patent: Feb. 22, 2005

(54) CIRCUIT SHELL ENCLOSURE

(76) Inventor: Thomas Edward Brown, 693 Melrose Rd., Lottsburg, VA (US) 22511

( * ) Notice: Subject to any disclaimer, the term of this patent is extended or adjusted under 35 U.S.C. 154(b) by 0 days.

(21) Appl. No.: 10/371,105

(22) Filed: Feb. 21, 2003

Related U.S. Application Data

(63) Continuation-in-part of application No. 09/865,746, filed on May 29, 2001, now abandoned.

(51) Int. Cl.⁷ .................................................. H05K 5/06
(52) U.S. Cl. ...................... 174/52.3; 361/752
(58) Field of Search ......................... 174/35 R, 35 GC, 174/52.3; 361/752, 753, 796

(56) References Cited

U.S. PATENT DOCUMENTS

| | | | |
|---|---|---|---|
| 5,239,126 A | * | 8/1993 | Oshiba ..................... 174/35 R |
| 5,594,199 A | | 1/1997 | Ciaccio |
| 6,018,461 A | | 1/2000 | Biermann et al. |
| 6,222,122 B1 | * | 4/2001 | Davidson ................... 174/52.4 |

* cited by examiner

*Primary Examiner*—Hung V. Ngo

(57) ABSTRACT

An enclosure for a circuit on a printed circuit board consisting of two boxes fastened to the opposite sides of the printed circuit board. The boxes each have one open side which faces the printed circuit board and seats against it with or without a gasket, creating protected areas under the boxes on both sides of the printed circuit board. The boxes are offset so that protected areas on one side of the board are directly opposite both protected and unprotected areas on the other side of the board. This allows the top sides of input/output devices installed on the board to be unprotected and accessible, while their solder sides are protected as are all components of the circuit and interconnecting wiring on both sides of the board.

2 Claims, 3 Drawing Sheets

CIRCUIT SHELL ENCLOSURE

CROSS REFERENCE TO RELATED APPLICATIONS

This is a CIP of application Ser. No. 09/865,746 filed 2001, May 29, now abandoned, by the present inventor.

FEDERALLY SPONSORED RESEARCH OR DEVELOPMENT

Not Applicable

SEQUENCE LISTING OR PROGRAM

Not Applicable

BACKGROUND OF THE INVENTION

This invention relates to enclosures, specifically for printed circuit boards.

Circuits on printed circuit boards often need to be enclosed to prevent physical damage, to keep out dust and moisture, and to eliminate electric shock and short circuit hazards. The prior art in enclosures for printed circuit boards consists of a large variety of metal and plastic boxes designed to support and totally contain the printed circuit board. Wires, cables, and pressure/vacuum tubing attached to the printed circuit board must either pass through the walls of the enclosure or terminate at input/output devices such as switches, displays, and controls mounted in the walls of the enclosure. This type of enclosure for printed circuit boards has the following deficiencies:

(a) Design of penetrations into an enclosure for egress of cables or for installing input/output devices adds significant engineering cost to the enclosure.

(b) Machining penetrations into an enclosure and installation of feed-through fittings and input/output devices adds significant manufacturing cost to the enclosure.

(c) Compression feed-through fittings used on the enclosure for cable egress cannot seal effectively around groups of individual wires.

(d) Feed-through connectors on the enclosure are redundant when connectors are also located on the printed circuit board.

(e) The enclosure becomes essentially part of the wiring harness and cannot be replaced or moved without considerable effort.

(f) Removing the lid of the enclosure allows only very restricted access, further hampered by enclosed cables, to one side of the circuit board for test, modification, or repair.

(g) The enclosure must be oversized to contain relief bends in cables and tubing, to provide working room for attaching terminals and connectors, and to contain extra cable or tubing for slack if the card is to be removed from the enclosure while operating for access during test, modification, or repair.

There is a need for an improved enclosure that protects the circuits on a printed circuit board without the above deficiencies.

BRIEF SUMMARY OF THE INVENTION

Accordingly, the advantages of the Circuit Shell Enclosure are that the above mentioned prior art deficiencies are eliminated as follows:

(a) There is no penetration of the enclosure so no engineering effort is required in that regard.

(b) No feed-through fittings or input/output devices are installed on the enclosure. Input/output devices and wiring or tubing connections are located only on the printed circuit board.

(c) Individual wires pose no special sealing problem and, like cable, can be run straight to terminals or connectors on the printed circuit board without first going through the enclosure, (d) There are no connectors on the enclosure so there are none redundant to the connectors on the printed circuit board.

(e) The enclosure stays completely separate from the wiring harness and can be removed or replaced without disturbing the wiring.

(f) The enclosure is easily removed without disturbing the wiring to give access to both sides of the operating printed circuit board for test, modification, or repair.

(g) The enclosure needs to be no larger than the printed circuit board since no working room is needed inside the enclosure for installing connectors, nor is room needed inside the enclosure to contain extra cable for relief bends or slack to allow removal of the board from the enclosure The Circuit Shell Enclosure thus provides complete protection of a circuit on a printed circuit board but does not restrict, encircle, enclose, or complicate external wiring connections to the board. Indeed, the external wiring is greatly simplified because there are no redundant connections or feed-through fittings in the walls of the enclosure, and no wiring to input/output devices installed in the walls of the enclosure. The Circuit Shell Enclosure is completely independent of the wiring and easily removed to gain unrestricted access to the operating board for test, modification, and repair. No enclosed coils of wire, tubing, or cable are needed to provide slack for removing the printed circuit board from the enclosure. The inexpensive and easy to manufacture Circuit Shell Enclosure is compatible with all types of standard printed circuit board mounted input/output devices.

The following description illustrates an embodiment of the Circuit Shell Enclosure but should not be construed as limiting the scope of the invention as determined by the appended claims and their legal equivalents.

DESCRIPTION OF THE SEVERAL VIEWS OF THE DRAWINGS

In the drawings

FIGS. 3A and 3B show a typical circuit board designed for the Circuit Shell Enclosure, and a cross section of the circuit board with the two boxes of the Circuit Shell Enclosure installed along with a typical circuit component, connector, and feed-through.

DETAILED DESCRIPTION OF THE INVENTION

Figure 1A:
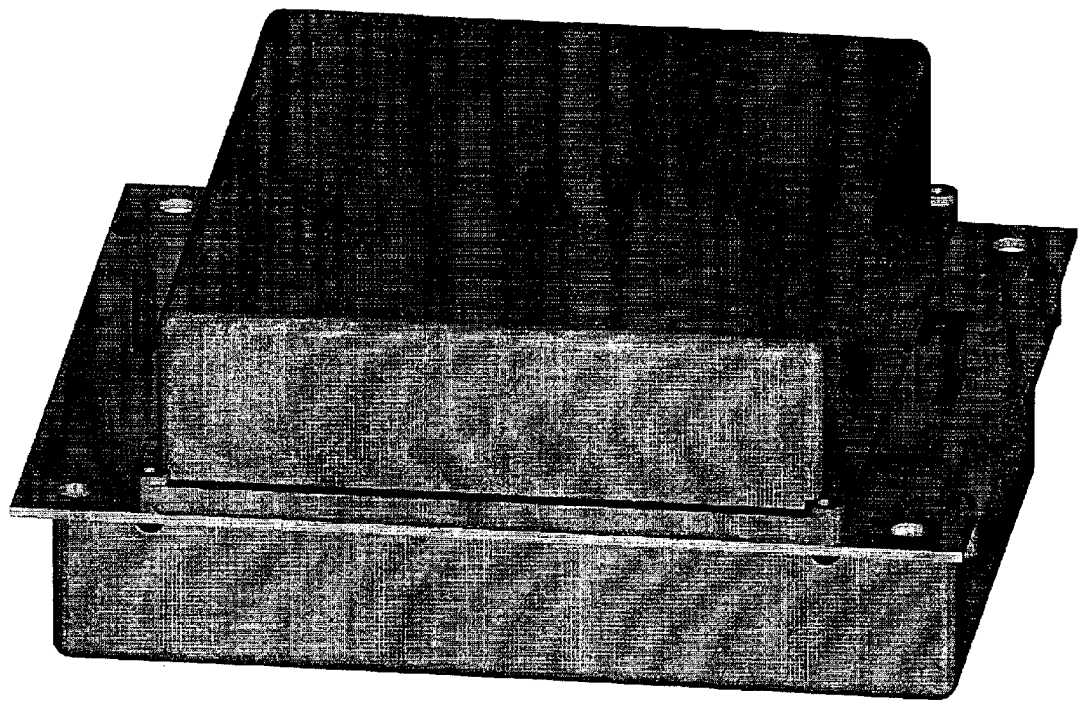
FIGS. 1A and 1B show perspective and elevation views of the two boxes comprising the Circuit Shell Enclosure attached to opposite sides of a printed circuit board.
Figure 1B:
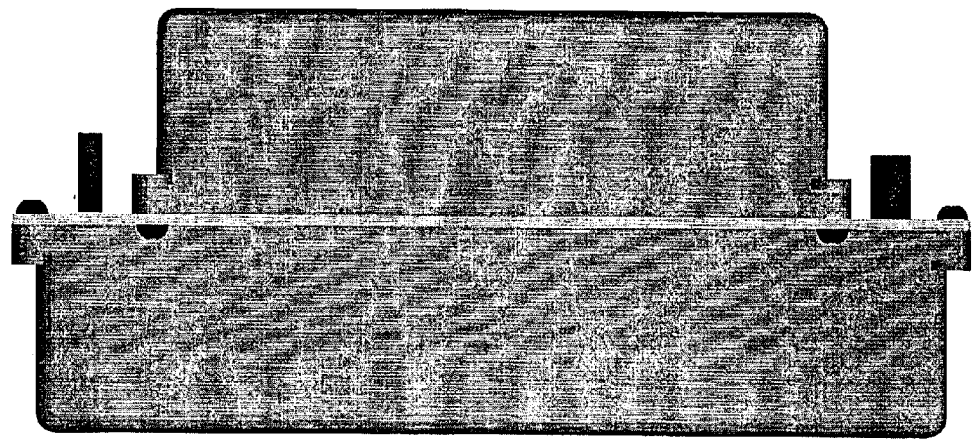
Figure 2A:
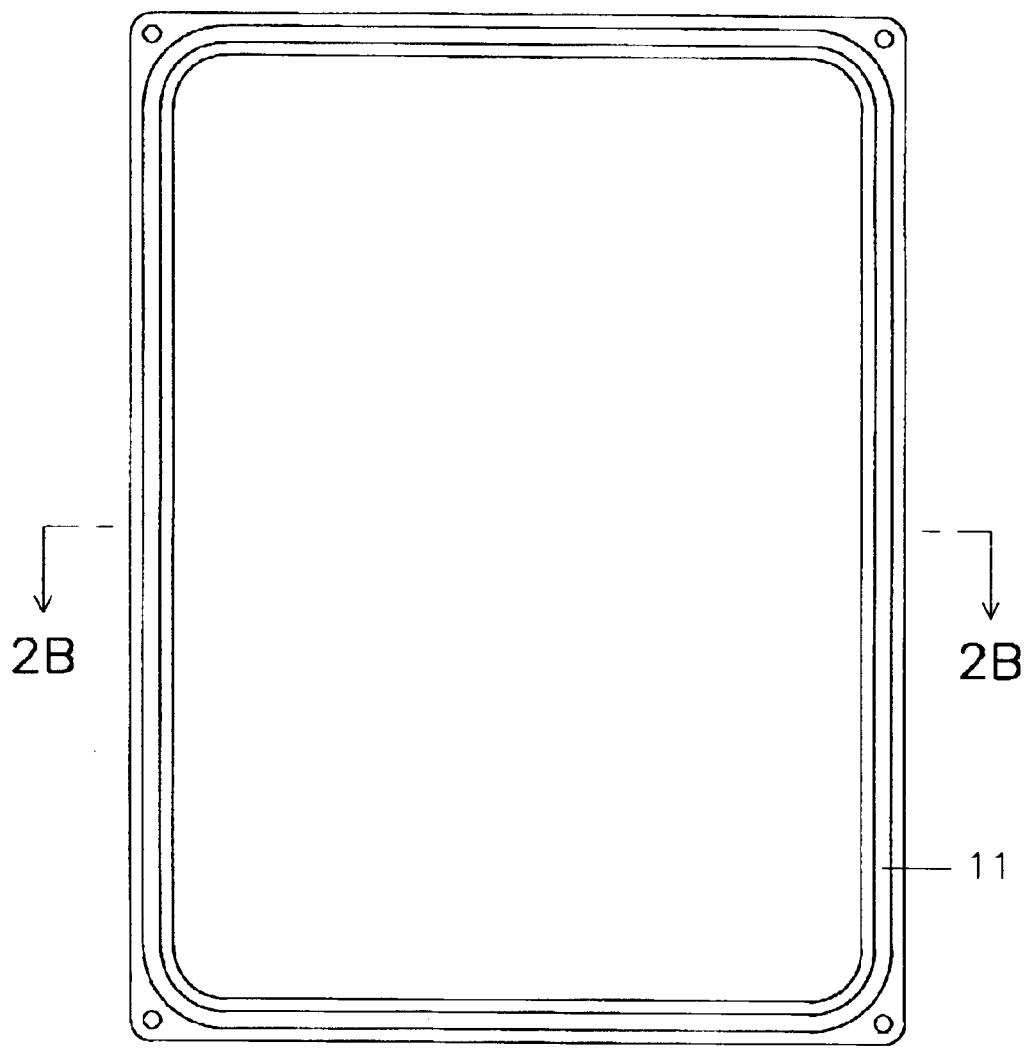
FIGS. 2A and 2B show the bottom view and cross section of one of the boxes.
Figure 2B:
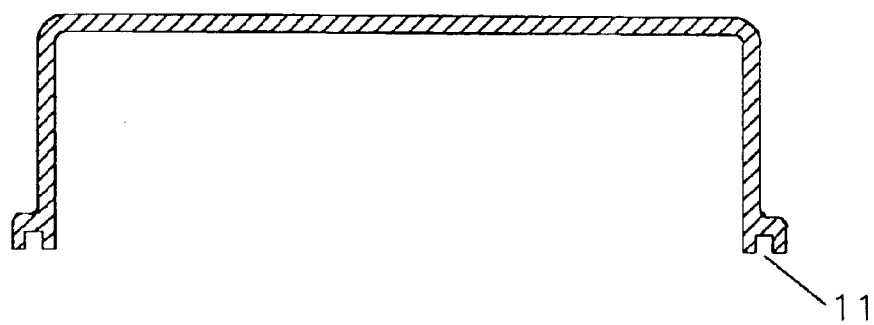
Figure 3A:
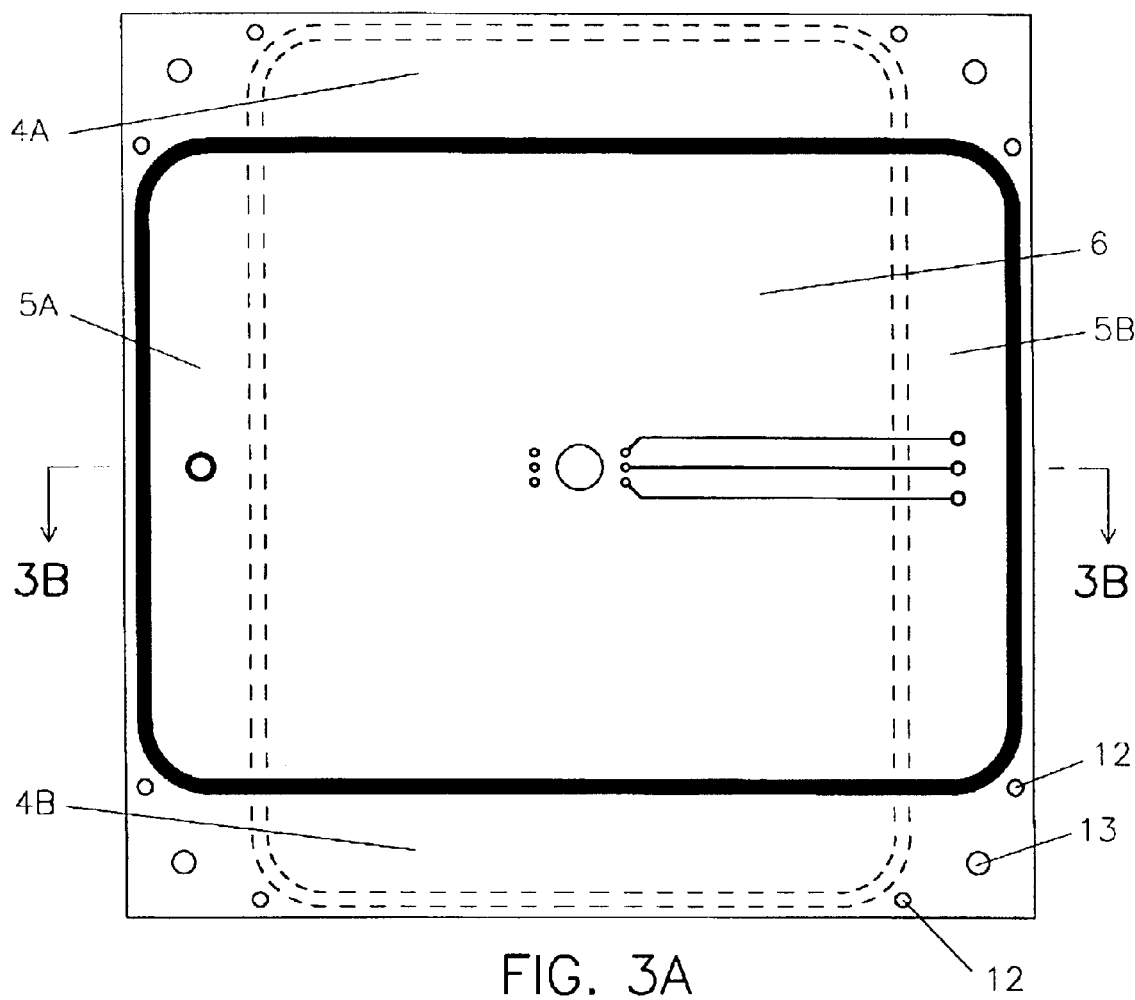

A typical embodiment of the present invention is shown in FIGS. 1A and 1B which are perspective and elevation views of a printed circuit board with the two boxes of the circuit shell enclosure attached to the top and bottom of the board. Although not required to be so constructed, the boxes in this embodiment are identical to reduce the number of parts, and are made of plastic by injection molding. In this embodiment the printed circuit board is 5.5 inches square and the boxes are 4.3 inches wide by 5.5 inches long by 0.7 inches deep. The boxes are fastened to opposite sides of the board with their long dimensions perpendicular to achieve the desired result of having the protected area on one side of the board opposite both protected and unprotected areas on the other side of the board. The boxes each have one open side which faces the printed circuit board and seats against the board with or without an optional perimeter gasket which in this embodiment is an o-ring. The perimeter gasket is simply omitted for applications where dust and moisture are not a problem, and only physical protection is needed. FIG. 2A shows the bottom of a box with a groove 11 to contain the o-ring, and four box mounting holes 12 outside the area enclosed by the o-ring. In this embodiment the mounting holes are sized to accept either self-threading screws or #4 machine screws and nuts for fastening to the printed circuit board. Alternately, threaded metal inserts could be installed in the mounting holes to eliminate the need for nuts. FIG. 2B shows the cross section of a box and the groove 11 to contain the o-ring. When the boxes are fastened to the printed circuit board, areas of the printed circuit board underneath the boxes and any contained components and interconnections are protected. FIG. 3A shows a bottom view of a printed circuit board laid out to accommodate the boxes and a simple example circuit. Although not necessary, printed circuit traces have been laid out where the top and bottom boxes (or gaskets when used) contact the printed circuit board, with the trace on the top of the board being shown in dashed lines. To achieve a flat surface it is desirable that either a continuous printed circuit trace as in this embodiment, or no traces at all be located where the gaskets contact the board. Screws are inserted into the holes 12 in the board and threaded into the four mounting holes in the corners of the boxes. With the boxes attached the corners of the board remain unprotected on both sides and have four board mounting holes 13 for attaching the board and enclosure assembly to a surface with brackets or stand-off posts.

OPERATION OF INVENTION

Figure 3B:
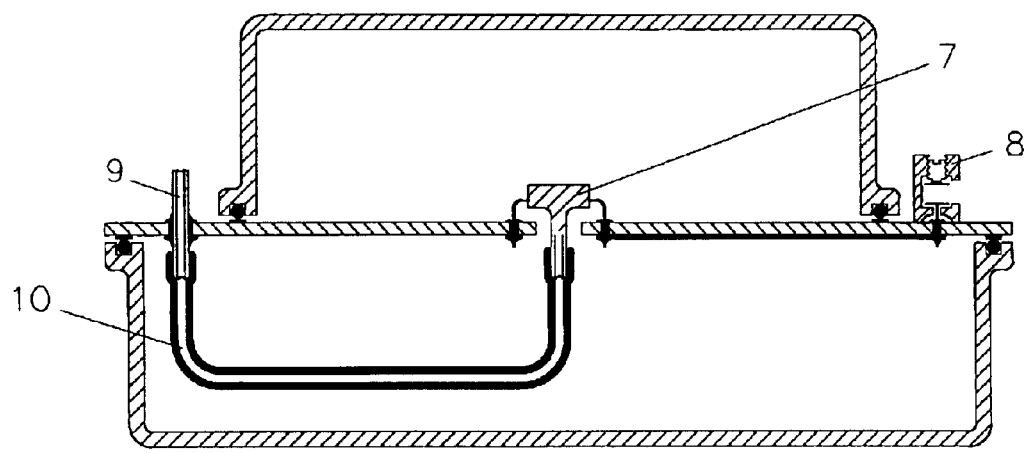

In FIG. 3A when the two boxes are in place there will be a central area 6 protected on both sides of the board. Areas 4A and 4B will be protected only on the top side of the board. Areas 5A and 5B will be protected only on the bottom side of the board. FIG. 3B shows a cross section of the printed circuit board with the boxes attached and with a typical circuit component and input/output devices installed. The circuit component in this example is a pressure sensor 7 which requires both electrical and physical connection to the outside of the enclosure. The electrical connection is accomplished by printed circuit traces on the bottom side of the board connecting pins of the pressure sensor with the solder side of a connector 8 soldered into holes in the board in area 5B. The physical connection of the pressure sensor is accomplished by plastic tubing 10 which connects the port of the pressure sensor to a feed-through fitting 9 which has been soldered into a hole in the board in area 5A. This example illustrates how the Circuit Shell Enclosure protects both sides of a circuit board where there are components and interconnections between components, and also protects the side of the circuit board where wires, traces, and tubing are run from components to various input/output devices which require unprotected access on the other side of the printed circuit board. Although areas 4A and 4B are not used in this simple example, it can be seen that additional input/output devices could be installed in those areas on the bottom side of the board having their solder sides on the top side of the board in protected areas. When there are holes in the printed circuit board for input/output devices but the devices are not installed, such as on a prototype board, the unused holes can be filled with solder to maintain the moisture and dust proof integrity of the protected areas.

CONCLUSION, RAMIFICATIONS, AND SCOPE

As has been shown, the printed circuit board in this invention functions as the mounting structure for the enclosure halves, rather than conversely as in prior art. Furthermore, the enclosure halves are offset, rather than mating as in prior art. These two departures from convention combine to make the Circuit Shell Enclosure a new paradigm in small enclosure design. No longer is it necessary to penetrate the enclosure halves for input/output access to the circuit board. All input/output devices are now located on the circuit board, an ideal situation due to the comparative ease of printed circuit board design and the comprehensive selection of board mounted input/output devices including connectors, feed-throughs, terminals, switches, controls, displays, emitters, and sensors. The savings on parts and labor during design and manufacture are considerable, and the benefits continue through the life of the product in improved access to the circuitry during upgrades, testing, and repair.

This invention has wide ramifications. It is suitable for all small circuit board enclosure applications including handheld, desktop, or wall-mount, either stationary or mobile. The boxes can be styled in many shapes, forms, and colors for product distinction. The protected areas available for circuits and input/output devices are controlled by the size and shape of the board and boxes and the way in which the boxes are offset. Additional circuit area can be gained by stand-off boards mounted to the main board in the areas underneath the boxes. If constructed of transparent material, the boxes will permit viewing of enclosed display or indicator components. Enclosed optical or RF sensors and emitters can communicate with the outside world through boxes made of the appropriate transmissive materials. Conductive materials or coatings used for the boxes and gaskets can provide shielding for enclosed circuits. Batteries can be either enclosed by the boxes or located in external compartments which plug into the board as input/output devices, and recesses can be designed into the boxes to accept these external battery compartments. Auxilliary mounting features can be molded into the boxes, such as clips which snap onto industry-standard DIN rails. Universal printed circuit boards can be designed for the Circuit Shell Enclosure with circuit pad arrays and a variety of connector footprints for general purpose and prototype use. Downloadable outlines of printed circuit boards compatible with the Circuit Shell Enclosure can be made available as templates which provide a starting point for design of custom printed circuit boards.

The above ramifications should not be construed as limiting the scope of the invention as determined by the appended claims and their legal equivalents.

What is claimed is:

1. An enclosure for a circuit contained on a printed circuit board, comprising:

two boxes, said boxes being attached to opposite sides of said printed circuit board by fastening means, said boxes each having one open side facing said printed circuit board, resulting in a protected area on both sides of said printed circuit board underneath said boxes, wherein at least one of said protected areas is opposite both protected and unprotected areas on the other side of said printed circuit board, said protected areas containing said circuit, at least one input/output device located in said unprotected area on said printed circuit board for external communication with said circuit, the unprotected area location of said input/output device being opposite said protected area on other side of said printed circuit board, said input/output device penetrating said printed circuit board and penetrating portion being located in said protected area for connection to said circuit.

2. The enclosure of claim 1 wherein said open side of at least one of said boxes has a perimeter gasket means for sealing against said printed circuit board.

* * * * *